(12) United States Patent
Tomekawa et al.

(10) Patent No.: US 7,056,571 B2
(45) Date of Patent: Jun. 6, 2006

(54) WIRING BOARD AND ITS PRODUCTION PROCESS

(75) Inventors: Satoru Tomekawa, Kishiwada (JP); Tetsuyoshi Ogura, Settsu (JP); Hiroyoshi Tagi, Katano (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 180 days.

(21) Appl. No.: 10/739,156

(22) Filed: Dec. 19, 2003

(65) Prior Publication Data
US 2004/0142154 A1     Jul. 22, 2004

(30) Foreign Application Priority Data
Dec. 24, 2002  (JP) ............................ P2002-372155

(51) Int. Cl.
*B32B 3/00* (2006.01)

(52) U.S. Cl. .............. 428/209; 428/901; 174/250; 174/255

(58) Field of Classification Search ........... 428/209, 428/901; 174/250, 255
See application file for complete search history.

(56) References Cited

U.S. PATENT DOCUMENTS

| | | | | |
|---|---|---|---|---|
| 3,902,951 A | * | 9/1975 | Doi et al. ................. 156/313 |
| 3,930,091 A | * | 12/1975 | Lewis et al. .............. 428/198 |
| 4,103,102 A | * | 7/1978 | Klein ....................... 174/254 |
| 4,680,220 A | * | 7/1987 | Johnson .................. 442/232 |
| 4,732,636 A | * | 3/1988 | Varker ..................... 156/252 |
| 5,236,777 A | * | 8/1993 | Inoguchi et al. ........... 442/60 |
| 5,780,366 A | * | 7/1998 | Appelt et al. .............. 442/19 |
| 5,807,793 A | * | 9/1998 | Scari et al. ................ 442/60 |
| 5,965,245 A | * | 10/1999 | Okano et al. ............ 428/209 |
| 6,207,259 B1 | * | 3/2001 | Iino et al. ................ 428/209 |
| 6,417,459 B1 | * | 7/2002 | Kanzaki et al. .......... 174/254 |
| 6,524,717 B1 | * | 2/2003 | Takano et al. ........... 428/450 |
| 6,558,780 B1 | * | 5/2003 | Suzuki et al. ............ 428/209 |

FOREIGN PATENT DOCUMENTS

| | | |
|---|---|---|
| EP | 1 275 696 | 1/2003 |
| JP | 2001-339130 | 12/2001 |

* cited by examiner

*Primary Examiner*—Cathy F. Lam
(74) *Attorney, Agent, or Firm*—Wenderoth, Lind & Ponack, L.L.P.

(57) ABSTRACT

There is provided a wiring board including an insulation substrate and a wiring layer which is located on at least one main surface of the insulation substrate, wherein the insulation substrate comprises a woven fabric which is made of yarns and an organic resin with which the woven fabric is impregnated, and at least one wiring of wirings which form the wiring layer extends over the woven fabric except for top portions of the yarns.

17 Claims, 5 Drawing Sheets

| | area where signal having frequency of not less than 1 GHz is transmitted | | area where signal having frequency of less than 1 GHz is transmitted |

WIRING BOARD AND ITS PRODUCTION PROCESS

BACKGROUND OF THE INVENTION

1. Field of the Invention

The present invention relates to a wiring board wherein a wiring layer is formed on an insulation substrate comprising a core member and an organic resin, and particularly to a resin wiring board wherein a wiring layer is formed on a woven fabric as a core member which is impregnated with an organic resin.

2. Description of Related Art

Hitherto, a glass-epoxy insulation substrate has been generally used for a resin wiring board. As such wiring board, for example, a through-hole wiring board and a build-up wiring board can be exemplified. In an insulation substrate which is used for such a wiring board, a woven fabric or a non-woven fabric is used as a core member which is mainly made of glass fiber yarns and which was impregnated with an epoxy resin alone or an epoxy resin in which an inorganic filler is dispersed. By using such insulation substrate, the resulted wiring board has a sufficient stiffness, so that the wiring board becomes convenient to mounting for example, a passive part, a semiconductor package and so on. In addition, since the glass fibers have a good moisture absorption property, they lead to a good connection reliability in the wiring board.

With the development of an electronic part which is of a compact size, of a high performance and/or of an enhanced function, the wiring boards become compacted and densified. When the wiring board is densified, the number of electronic parts mounted on the wiring board is increased, and transmission of a high speed signal, particularly a high frequency signal is required to be transmitted in the wiring board. Upon such a requirement an insulation material which is used for the wiring board is requested to be improved in its dielectric properties (especially, a dielectric loss) so as to reduce a transmission loss. In order to meet such request, it is proposed to use an insulation substrate which comprises a woven glass fabric impregnated with a cyanate ester based resin, a polyphenylene ether resin or the like which has a lower transmission loss compared with a conventional epoxy resin (see, for example, Japanese Patent Kokai Publication No. 2001-339130).

SUMMARY OF THE INVENTION

It is an object of the present invention to provide a wiring board in which transmission of a high speed signal is improved, and thus a wiring board in which transmission of a high frequency signal is improved even when the conventional insulation substrate is used.

In a first aspect, the present invention provides a wiring board comprising an insulation substrate and a wiring layer which is located on at least one main surface of the insulation substrate wherein the insulation substrate comprises a woven fabric which is made of yarns (or threads) and an organic resin with which the woven fabric is impregnated, and at least one wiring of wirings which form the wiring layer extends over the woven fabric except top portions of the yarns.

In a second aspect, the present invention provides a production process of a wiring board which comprises an insulation substrate and a wiring layer which is located on at least one main surface of the insulation substrate wherein the insulation substrate comprises a woven fabric and an organic resin with which the woven fabric is impregnated, and the woven fabric is made of yarns (or threads), which process comprises forming at least one wiring of wirings which form the wiring layer such that at least one wiring extends over the woven fabric except top portions of the yarns.

According to the present invention, said at least one wiring of the wiring which form the woven fabric extends over the woven fabric except the top portions of the yarns forming the woven fabric. In particular, said at least one wiring extends non-parallel to directions along which the yarns of the woven fabric extend, and extends over the woven fabric except the top portions of the yarns; or said at least one wiring extends parallel to directions along which the yarns of the woven fabric extend and extends over the woven fabric except the top portions of the yarns, and preferably extends over a border portion in the woven fabric between a warp and a weft which form the woven fabric. As to said at least one wiring, a distance (particularly, the shortest length) from such wiring to the yarn can be longer compared with a wiring which extends over the top portions of the yarns. As a result, as far as said at least one wiring concerns, effects of dielectric properties of the yarns which are inferior to those of the organic resin are suppressed as much as possible compared with the case of the wiring which extends over the top portions. In other words, the dielectric properties of the insulation substrate under said at least one wiring are superior to those under the wiring which extends over the top portions of the yarns, so that the transmission loss of said at least wiring becomes smaller with said at least one wiring.

In addition, such longer distance from said at least one wiring to the yarn leads to a larger amount of the organic resin under said at least one wiring compared with an amount of organic resin under the wiring extending over the top portions, so that adhesion condition between said at least one wiring and the insulation substrate is improved, which results in the provision of the wiring board having improved connection reliabilities.

Especially, the effect of the dielectric loss on the transmission loss is larger in the high frequency range of the signals to be transmitted, and therefore the wiring board according to the present invention can work more effectively in the high frequency range.

DETAILED DESCRIPTION OF THE

INVENTION

In the present invention, the wiring board means a board which has a wiring layer on its at least one main surface and which functions as predetermined. Such wiring board can constituted an intended electronic device by itself or optionally by connecting other wiring board(s), electronic part(s) and the like to the wiring(s) formed on the former wiring board. The wiring board comprises said at least one wiring layer and the insulation substrate.

The wiring layer is present in the form of a layer on the insulation substrate, and defined as an assembly (or combination) of wirings which assembly, in order that the wiring board electrically functions as predetermined, comprises said at least one wiring, generally a plurality of said at least one wiring and usually many of said at least one wiring as well as a necessary other wirings(s) (the number of which may be singular or plural, and usually large) which extends over the top portions of the yarns.

In the present specification, the term "wiring (including also said at least one wiring)" is intended to means a layered electrical conductor which extends usually in an elongated form between connection elements (such as a terminal, a land, a pad or the like) on the wiring board. Those connection elements are used for connecting an electronic element such as an electronic part to the wiring board. The wiring (including also said at least one wiring) generally has a narrow width, and it is usually constituted by a single line-segment like conductor or a plurality of line-segment like conductors which are connected with each other. In the latter case, the wiring is in the form of a polygonal line having a 90° corner. A material for the formation of the wiring may be any appropriate one, and it is for example, copper, aluminum or the like.

As explained below, with the wiring which extends over the woven fabric except the top portions of the yarns as described above (namely, said at least one wiring) as described above, the dielectric loss is advantageously suppressed even when said at least one wiring is used in a in a high frequency region, that is, even when a high frequency current (or electric signal) flows through said wiring. Said at least one wiring is convenient for working in a high frequency range, particularly not less than 1 GHz, more particularly not less than 2 GHz, for example in the range between 5 GHz and 25 GHz. Said at least one wiring has a width in the range between 25 μm and 300 μm and preferably between 100 μm and 200 μm.

The manner for the formation of the wiring layer which is an assembly of wirings may be any appropriate one which has been conventionally used for the formation of a wiring layer for the production of a wiring board. For example, a metal foil (such as a copper foil, an aluminum foil or the like) is laminated on and bonded to each surface of an insulation substrate, followed by electrically connecting the both foils through a plated through hole or a mass of a conductive paste, and then etching is carried out so as to form wiring layers which comprise predetermined wirings.

In the present invention, the insulation substrate is formed of a woven fabric and an organic resin with which the woven fabric is impregnated. The woven fabric is a cloth which is produced by weaving while using yarns, and therefore, the woven fabric is of a sheet form which has a two-dimensional spread and its thickness dimension is smaller relatively to the other dimensions. The yarn is an element which forms the woven fabric, and it is a thin elongated material. The yarn may be constituted by a single fiber or by a plurality or many of fibers. In the present invention, the yarn may be in the form of a bundle of the yarns as described above.

In other words, the woven fabric is a cloth which is generally referred to a "textile", and the yarn is not particularly limited as far as it is any element made of a fiber which element is used for the production of the textile as a weft or a warp. As to a thickness, a form (for example, a monofilament form, a multi-filament form and a bundle form) and the like of the yarn which forms the woven fabric, they are not particularly limited as far as they can form a woven fabric which can be used for the wiring board. A diameter of the yarn (or a width of the yarn in a plan view (such as FIG. 1) of the woven fabric or a long axis when a cross section of the yarn is oval) is for example in the range between 250 μm and 500 μm and preferably between 300 μm and 500 μm. Further, a pitch when arranging the yarns is for example in the range between 300 μm and 600 μm and preferably between 400 μm and 550 μm.

It is noted that a relationship between the width of said at least one wiring and the pitch of the yarns is preferably such that the width of said at least one wiring is smaller than the pitch of the yarns, and the width of said at least one wiring is desirably smaller than the thickness (or the width or the diameter) of the yarn. The width of said at least one wiring is preferably not larger than one third, more preferably not larger than one fifth, and the most preferably one tenth, for example one twentieth of the of the pitch of the yarns. When the pitch of the wefts is different from that of the warps, the above mentioned ratios are applicable to the smaller pitch.

A material of the yarns is not particularly limited as far as they are used for the production of the woven fabric for the insulation substrate. For example, a glass, an aramid resin, a PTFE (polytetrafluoroethylene) and the like may be used as such material. For example, glass fibers, aramid fibers or PTFE fibers which may be bundled are used as the yarns.

The organic resin of the insulation substrate may any appropriate one as far as it is used for the impregnation of the above described woven fabric upon the production of the insulation substrate, and such resin may be for example thermoplastic or thermosetting. As a thermoplastic resin, a polyimide resin may be exemplified. As a thermosetting resin, a cyanate ester resin, a polyphenylene ether resin, a phenol resin, a naphthalene resin, a urea resin, an amino resin, an alkyd resin, a silicon resin, a furan resin, an unsaturated polyester resin, an epoxy resin, a polyurethane resin and the like are exemplified. Those organic resins may optionally contain inorganic fillers dispersed therein.

As to the insulation substrate which is used in for the wiring board according to the present invention, dielectric properties of the woven fabric (or the yarns forming the fabric) are inferior to those of the organic resin with which the fabric has been impregnated. It is noted that the term "dielectric properties" in the present specification means an extent of difficulty for electricity in flowing through a material in question, and such an extent can be estimated by a property of "relative dielectric constant ($\epsilon$) or dielectric loss tangent (tan $\delta$) as a measure. With the insulation substrate which is used according to the present invention, the relative dielectric constant of the woven fabric (or the yarns which form the fabric) is larger than that of the organic resin. In addition to or alternatively to this, the electric loss tangent of the woven fabric (or the yarns which form the fabric) is larger than that or the organic resin. It is noted that as to the insulation substrate which is used according to the present invention, the dielectric properties of the fabric and the organic resin can be measured by a molecular orientation analyzer. For example, Microwave Molecular Orientation Analyzer 6000 available from Oji Scientific Instruments (Japan) may be used. Measurement basis thereof is known as follows: A peak and an acutance of resonance are obtained with sandwiching a woven fabric or a plate form organic resin in a cavity resonator; also a peak and an acutance of resonance are obtained without a sample in the cavity resonator; and a relative dielectric constant is calculated from a difference between the peaks while a dielectric loss tangent is calculated from a difference between acutances. Combinations of the yarns and the organic resin which form the above explained insulation substrate are for example glass fiber yarn/epoxy resin, aramid fiber yarn/polyimide resin and PTFE yarn/polyphenylene oxide resin.

In the present invention, the woven fabric is a woven material which is formed of a plurality of warps and a plurality of wefts. Those plural warp yarns all extend parallel to each other, that is, they are located side by side. Also, those plural weft yarns all extend parallel to each other, that is, they are located side by side. The warps and the wefts are arranged to generally cross orthogonally (namely, to form an angle of 90 degrees), but they may be arranged to form other predetermined angle.

It is to be noted that the yarn is very thin compared with the size of the woven fabric, and therefore it is often that the present invention is readily understood when the invention is explained while neglecting a thickness of the yarn. In such case, it is convenient that the yarn is regarded substantially as a straight line. In the present specification, when the yarn is explained while using terms relating to geometry (such as being parallel, crossing, forming an angle, being arranged side by side, and longitudinally), the yarn is assumed to be a straight line (without a thickness). In the present specification, whether the yarn is assume to be a straight line or not is readily understood by those skilled in the art based on the context.

In the wiring board according to the present invention, the woven fabric is for example a plain weave wherein each warp extends across and alternately above and below, for example, one of plural parallel wefts one after another while each weft extends across and alternately above and below, for example, one of plural parallel warps one after another, and the warps and the wefts are crossing orthogonally, i.e. to form an angle of 90°. The woven fabric may be of any other appropriate structure as far as it is used for the production of the wiring board, and the woven fabric may be for example a twill weave, a satin weave and so on.

In any of the woven fabrics, a cross section of the yarn which is perpendicular to its extending direction (i.e. longitudinal direction) may be for example circle, elliptic, oval, rectangular or flat. For example, when watching a certain warp of a woven fabric (i.e. when watching such warp on a microscale), it is passing regularly and alternately above and below a single or adjacent plural wefts, and therefore the warp extends in a regular wave form across a plane of the woven fabric (i.e. alternately above and below the plane). In the present invention, the top portion means a portion of such wave form yarn of which level is the highest (i.e. a portion of the wave of which level is the highest, and thus which is the closest to a main surface of the insulation substrate on which a wiring is placed). In the woven fabric, each yarn has such top portions regularly or periodically (usually at every interval of a pitch of the yarns). Thus, the yarn extends as if it were a straight line as a whole (or when viewing on a macroscale) while it extends generally in a regular wave form when viewing on a microscale. Therefore, the woven fabric is flat as a whole while having regular roughnesses.

Figure 1:
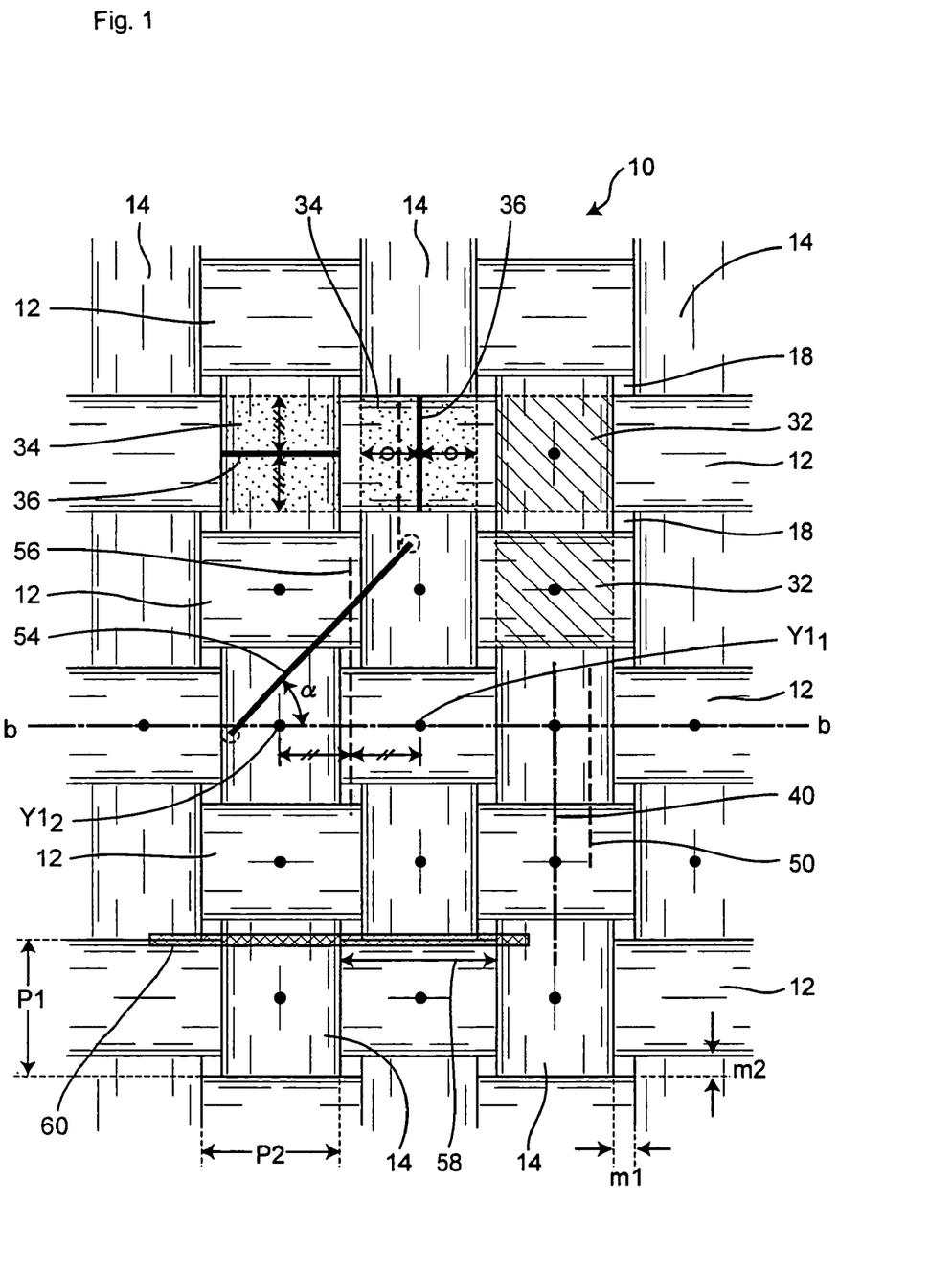
FIG. 1 shows a schematic view (or a plan view) of a woven fabric of a wiring board when viewing from the above thereof, and also shows locations of wirings which can be used in a wiring board according to the present invention.
Figure 2:
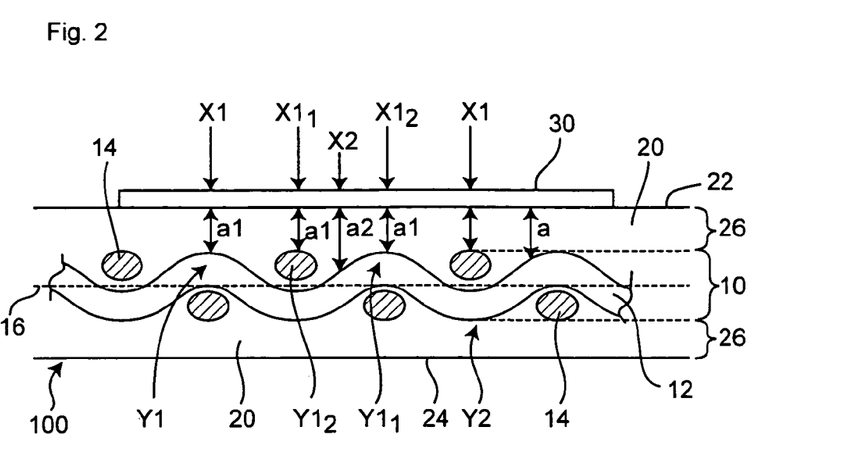
FIG. 2 schematically shows a cross sectional view along a line b—b in FIG. 1.

The above explanations will be described more concretely with reference to FIGS. 1 and 2 which schematically show a plain weave fabric as an example of the woven fabric. FIG. 1 shows a plan view of a woven fabric 10 (i.e. a look of a spread woven fabric when viewing from its above). FIG. 2 shows a portion of the woven fabric 10 of FIG. 1 in a cross section view along a ling b—b of FIG. 1. It is to be noted that the woven fabric in FIG. 2 is impregnated with an organic resin as explained below.

The woven fabric 10 is composed of a plurality of wefts 12 (of which arranging pitch is P1) and a plurality of warps 14 (of which arranging pitch is P2) as shown in FIG. 1. Each of the wefts 12 is passing alternately over and under a warp 14 which extends parallel to its next warp so that each weft 12 substantially orthogonally crosses each warp 14. It is noted that each weft 12 is separated from its adjacent weft 12 by a distance m2, and each warp 14 is separated from its adjacent weft 14 by a distance m1. In the embodiment shown in FIG. 2, the yarn has an oval cross section which is perpendicular to an elongated direction of the yarn. The weft 12 is passing over an under every single warp 14 alternately in the shown embodiment, and such single warp 14 may be replaced with any plural number of the warps 14. Alternately, the weft 12 is passing alternately over and under any combination of a single warp and any plural warps. These are applicable also to the warp 14.

The woven fabric 10 is flat when viewing on a macroscale, but as seen from FIG. 2, the yarns extend in the wave form across and alternately above and below the plan surface of the woven fabric when viewing on a microscale. In detail, the weft 12 is passing in the wave form alternately above and below a flat plane 16 of the woven fabric (which plane is shown as a dotted line in FIG. 2, that is, a plane which is seen when viewing the woven fabric on a macroscale), and the same is applicable to the warp 14. It is noted that the flat plane of the woven fabric is intended to mean a virtual surface 16 which passes wave centers of the yarns forming the woven fabric. The wave center means a mid point of the wave between a top portion and its adjacent bottom portion of the wave of the yarn. Therefore, the flat plane is a plane which divides a thickness of the woven fabric (i.e. a difference in level between the top portion Y1 and the bottom portion Y2) into two equal thickness portions.

In the insulation substrate, the organic resin with which the woven fabric is impregnated fills spaces formed by the yarns of the woven fabric and also forms a coating layer on a main surface of the woven fabric. Such insulation substrate is schematically shown in FIG. 2. The insulation substrate 100 comprises the woven fabric 10 and the organic resin 20 as shown in FIG. 2. Generally, the yarns 12 and 14 which form the woven fabric are note exposed on the main surfaces 22 and 24 of the insulation substrate. As a result, fine irregularities of the woven fabric are flattened by the coating layer 26 of the organic resin, and a wiring layer is place on thus flattened surface of the insulation substrate, that is on the coating layer 26. In an advantageous embodiment according to the present invention, a thickness of the coating layer 26 is relatively small, wherein the effects of the present invention become remarkable. In a particularly advantageous embodiment, the thickness of the coating layer is in the range between 1 μm and 25 μm. When the thickness is smaller than such range, adhesion between the insulation substrate and the wiring layer thereon may be insufficient. Also, when the thickness of the coating layer is larger than such range, the effects of the present invention may be not so outstanding.

Since each yarn extends in the wave form in the woven fabric, a distance from a surface of an exposed surface 22 of the insulation substrate 100 to the yarn is not constant over the exposed surface 22 of the insulation substrate. Therefore, when a wiring is formed on such insulation substrate, the organic resin and the wave form yarns are present beneath the wiring, and the distance from the wiring (or a portion of the wiring) to the yarn varies depending on a position at which the wiring (or a portion of the wiring) is located.

For example, it is assumed that a wiring 30 is formed right above the weft 12 as shown in FIG. 2. With respect to a wiring portion X1 which is located above a top portion of the weft 12 (for example Y1), a distance from the wiring portion to the yarn is shorter than any other wiring portion (such distance is referred to as a1). To the contrary, with respect to a wiring portion X2 which is located over the middle of a top portion of the weft 12 (for example $Y1_1$) and its adjacent top portion of the weft 12 (for example $Y1_2$), a distance from the wiring portion to the yarn is longer (such distance is referred to as a2). As explained above, when a wiring layer is formed on an insulation substrate to include various predetermined wirings, the distance from the wiring portion to the yarn depends on the position of the wiring portion. Further, there is only the organic resin beneath a wiring portion which is located above an opening (or weaving aperture) 18 of the woven fabric. It is noted that the term "wiring portion" means a part of a wiring which forms the wiring.

A transmission loss when a current flows through a wiring formed on an insulation substrate essentially consisting of a yarn and an organic resin is affected by a material which is located beneath the wiring. The longer the distance from the wiring to the yarn of the insulation substrate is, the larger the effect of the organic resin is, so that the effect of the yarns becomes smaller. To the contrary, when the distance from the wiring to the yarn of the insulation substrate is shorter, the effect of the yarn cannot be neglected. Since the yarns extend in the wave form in the woven fabric, the wiring portion X1 which is located above the top portion of the yarn is greatly affected by the yarn. To the contrary, the wiring portion X2 is less affected by the yarn. Particularly, the wiring portion which is above the opening 18 of the woven fabric is much less affected by the yarn.

As described above, the dielectric properties of the woven fabric which constitutes the insulation substrate are inferior to those of the organic resin. Therefore, the wiring portion which is located above the top portion (Y1) of the yarn wave is affected by the inferior dielectric properties of the yarn. Thus, it is preferably that the wiring portion is not located above the top portion of the yarn in the wave form. When the distance from the wiring portion to the yarn which is located below the wiring portion is larger, the effects of the yarn are suppressed as to the dielectric properties while the effects of the organic resin which are preferable as to the dielectric properties are enlarged.

It is noted that the embodiment as an example is explained wherein the wiring layer is formed on the upper main surface of the insulation substrate (as shown in FIG. 2), but the above explanations as to the distance between the yarn and the wiring portion are also applicable to an embodiment wherein a wiring layer is formed on a bottom main surface of the insulation substrate as well as an embodiment wherein a wiring layer is formed on each of an upper main surface and a bottom main surface of the insulation substrate.

In the present invention, the top portion means a portion Y1 of the wave-form extending yarn of which level is the highest, and which is the closest to the main surface of the insulation substrate on which surface the wiring layer is placed. The wave which forms the woven fabric is substantially regarded to be periodical continuation of a shape of, for example, a sine wave, and therefore the top portion Y1 as described above are necessarily and regularly present in the woven fabric. In the embodiment of an plain weave wherein warp yarns and weft yarns are crossing orthogonally of which cross sections are circle or oval respectively (that is, the embodiment as shown in FIG. 2), center portions of areas where the warp yarns and the weft yarns are overlapping with each other correspond to the top portions.

The area where the warp yarn and the weft yarn are overlapping means a rectangle or square region 32 as shown in FIG. 1 with the slant lines. The center portion of such area is an intersection of diagonal lines of the rectangle or square, and such center portion corresponds to the top portion Y1. It is noted that the yarn overlapping area is a square in an embodiment wherein the wary yarn and the weft yarn have the same thickness and those yarns are arranged with the same pitch, or the area is generally a rectangle in the other embodiment. In FIG. 1, examples of the top portions which are present along a line b—b as well as other example top portions are shown with "• (black dot)" when each of the yarns forming the plain woven fabric has a circle or oval cross section. In this embodiment, the top portions are regularly located along an axis of the yarn.

Further, when cross-sections of the yarns forming the woven fabric are rectangular, top portions are present along a line of an upper side yarn in the yarn overlapping area which line is perpendicular to an extending direction of the upper side yarn and which line passes the center of the overlapping area. For example, when the warp and the weft yarns forming the plain woven fabric as shown in FIG. 1 have flat rectangular cross-sections, the top portions are periodically present along a line (strictly, a line segment) 36 which is parallel to the weft yarn or the warp yarn extending direction and which passes a center of a rectangular or square (overlapping) area 34 which is shown with dots.

In the present invention, when the wiring portions are located above the top portions as described above, those wiring portions are affected by the dielectric properties of the yarns which are inferior to those of the organic resin, and therefore such location of the wiring portions is not preferable. Therefore, in the wiring board according to the present invention, it is particularly preferably that all of the wiring portions of said at least one wiring are necessarily located above the woven fabric except the top portions of the yarn. For example, when a wiring layer is formed on the coating area 26 of the organic resin of the insulation substrate comprising the woven fabric 10 as shown in FIG. 1, at least one wiring which forms the wiring layer does not extends over the top portions shown with the black does (•), that is, said at least one wiring is formed. It is to be noted that said at least one wiring itself does not extends over the black dots (•) at all.

As far as said at least one wiring is concerning, it is more preferable that said at least one wiring is to be located such that the number of the wiring portions is as large as possible which portions are so formed that their distances from them to the yarns are large. It is more preferable that said at least one wiring is to be located such that the number of the wiring portions is as large as possible which portions are so formed that their distances from them to the yarns are largest. Particularly, when the woven fabric has weave openings, said at least one wiring is preferably formed such that the wiring portions are located above the openings.

In one preferable embodiment, said at least one said wiring is present above the woven fabric except the top portions of the yarns as described above and adjacent portions around the top portions. A height (or level) of such adjacent portion of the yarn is preferably at least 90%, more preferably 80% and most preferably 70% of the height (or level) of the top portion of the yarn. It is noted that the height (or level) of the yarn means a distance from the virtual plane 16 as described above to the adjacent portion of the yarn (particularly to a point of the adjacent portion of the yarn which point is the closest to the main surface of the insulation substrate). That is, as to yarn portions which are located below said at least one wiring, a distance from the virtual plane to the outermost point of any of the yarn portions does not exceed 90% or any other above mentioned percentage of the distance from the virtual plane to the top of the yarn.

Concretely, in the wiring board according to the present invention, at least one wiring, preferably plural wirings, and more preferably many wirings do not extend over the top portions and optionally the adjacent portions thereof of the yarns, that is, the wiring layer is formed such that said at least one wiring is located above the yarn portions except the yarn top portions and optionally the adjacent portions thereof. Positional relationships between the yarns and the wirings when viewing from the above of the wiring board as shown in FIG. 1 will be explained below while neglecting the presence of the organic resin for the ease of understanding.

In one embodiment, said at least one wiring extends parallel to the extending directions of the yarns, and does not pass over the top portions of the yarns. One example of such embodiment is shown as said at least one wiring with a broken line 50 in FIG. 1. It is noted that the extending direction of the yarn corresponds to a direction of an axis 40 of the yarn in the plan view as shown in FIG. 1.

In other embodiment, said at least one wiring extends to form angles with the extending directions of the yarns (that is, to slant with respect to the extending direction of the yarn), and does not pass over the top portions of the yarns. One example of such embodiment is shown as said at least one wiring with a thicker solid line 54 in FIG 1. In such embodiment, the extending direction of the yarn corresponds to a line b—b. Forming an angle with the extending direction of the yarn means that an angle α is formed when the line b—b and the wiring 54 in the form of a line segment intersect each other. Such angle is any appropriate one, and in the above mentioned embodiment wherein said wiring extends parallel to the yarn, the angle is 0°.

In more preferable embodiment, said at least one wiring not extending over the top portions of the yarn is, for example, at least one wiring which extends parallel to an extending direction of a warp, which passes the middle point between a center of an area where the warp and the weft are overlapping (which center corresponds to $Y1_2$ in FIG. 1) and a center of an area adjacent to said area where the warp and the weft are overlapping (which center corresponds to $Y1_1$ in FIG. 1), and which extends substantially perpendicular to a line connecting those centers. One example of such wiring is shown as said at least one wiring with a broken line 56 in FIG. 1. Such said solid wiring is a wiring which extends parallel to the warp 14 and which contains the wiring portion X2 in FIG. 2, and can be said to extend over concave portions of the yarns in the woven fabric 10.

In another more preferable embodiment, said wiring not extending mover the top portions of the yarns is located over an area of the woven fabric which area contains a border portion between the warp and the weft and which area extends along a direction which is the same as an extending direction of the border portion when viewing the woven fabric from its above while being spread. As an example of this embodiment, said at least one wiring 60 is shown in FIG. 1 which wiring is located over such the area which contains the border portion 58 between the warp and the weft and which area extends along the extending direction of the border potion. It should be noted that the border portion 58 is shown shifted below the wiring 60 since the border portion 58 and the wiring 60 are overlapping with each other.

In a further more preferable embodiment, the wiring layer is formed such that said at least one wiring not extending over the top portions of the yarns extends over at least one weaving aperture 18. This embodiment is particularly effective when the aperture is of a large size. It is noted that the aperture 18 becomes smaller (as shown in FIG. 1) when an interval between the two parallel adjacent warps and/or wefts is narrower. Even though the size of the aperture is small, the effects of the yarns are relatively suppressed as to the wiring portions which are located above the apertures.

The wiring board according to the present invention as described above is produced by a process for the production of a wiring board which process comprises forming a wiring layer such that at least one wiring of wirings which form the wiring layer extends over the woven fabric except the top portions of the yarns, and preferably such that such at least one wiring is any one of said at least one wiring of the above described embodiments.

The formation of the wiring layer itself on the insulation substrate may be carried out any conventional process which has been performed hitherto provided that a wiring layer is so designed that it comprises said at least one wiring based on yarn extending directions and a pitch of warp yarns and a pitch of weft yarns. It is noted that the pitch means a distance between corresponding positions of two adjacent parallel yarns. Upon practically forming the wiring layer, the yarn extending directions and positions of the top portions are checked beforehand, a designed wiring layer is located on the insulation substrate based on the results of such checking such that said at least one wiring extends over the woven fabric except the top portions.

It is noted that the organic resin is generally transparent, checking and confirming the yarn extending directions and the positions of the top portions can be carried out in any appropriate optical manner which has been conventionally used. Alternatively, marks are given to the insulation substrate beforehand which are related to the yarn extending directions and the positions of the top portions, so that the yarn extending directions and the positions of the top portions can be recognized with the marks. Based on the yarn extending directions and the positions of the top portions which are thus recognized, the wiring layer is formed.

Figure 3:
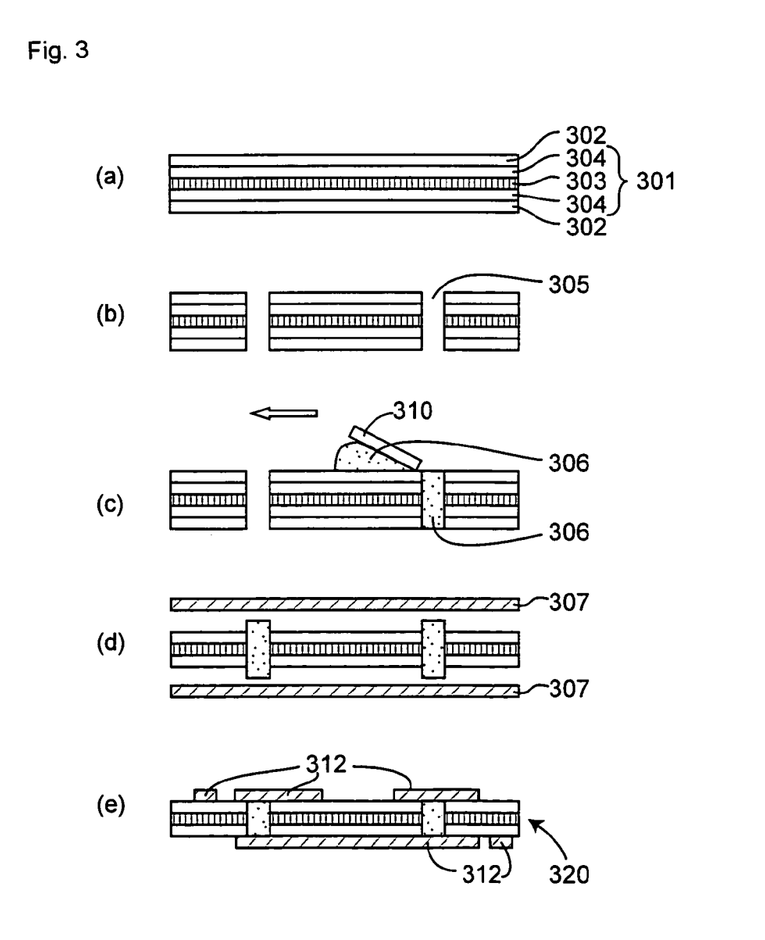
FIG. 3 schematically shows a process stepwise for the production of a wiring board according to the present invention.

For example, the wiring board, for example a double sided wiring board according to the present invention is produced as follows: each surface of an insulation substrate 301 is laminated with a release film 302 (made of for example a polyester) as shown in FIG. 3(*a*). The insulation substrate 301 is for example a woven fabric 303 such as a glass woven fabric which was impregnated with a known organic resin 304.

Then, a through hole 305 is formed through the insulation substrate 301 at a predetermined position by using for example a laser processing manner as shown in FIG. 3(*b*). Thereafter, the through holes 305 are filled with an electrically conductive paste 306 using for example a squeegee 300. The conductive pastes is for example a composite material which comprises an electrically conductive powder and a thermosetting resin. As the conductive powder, for example powder of at least one selected from gold, silver, copper, nickel, lead and tin may be used. Further, powder of which particle is made of any one of the above mentioned metals and coated with the other metal of the above mentioned metals may also be used. As the thermosetting resin, for example the following known resin may be exemplified: a phenol resin, a naphthalene resin, a urea resin, an amino resin, an alkyd resin, a silicon resin, a furan resin, an unsaturated polyester resin, an epoxy resin, a polyurethane resin and the like. Optionally, any combination of these resins may be used.

Then a metal foil 307 is laminated on each surface of the insulation substrate 301 after the release films 302 are removed, and the metal foils and the substrate are pressed together along a thickness direction while being heated as shown in FIG. 3(*d*). Thereafter, confirming the yarn extending directions and the positions of the top portions of the yarns, and then as shown in FIG. 3(*e*), the wiring layers 312 are formed by an etching process such that it includes said at least one wiring, that is, a predetermined wiring (or plural predetermined wirings) which does not extend over the top portions of the yarns, which results in the both sided wiring board 320 according to the present invention.

Figure 4:
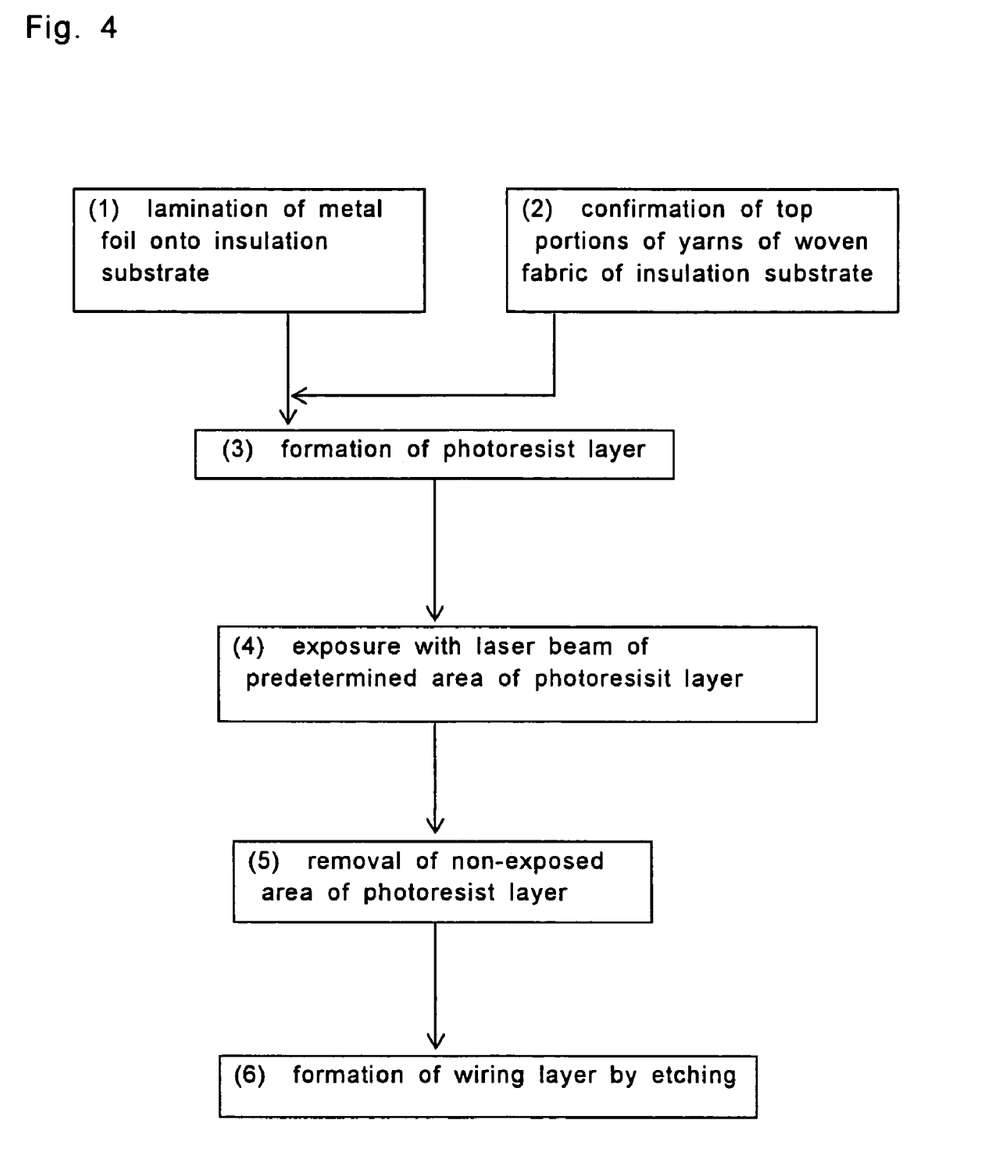
FIG. 4 is a flow chart which shows a step for the formation of a wiring layer of a wiring board according to the present invention.

Upon the formation of the above explained wiring layer, when a direct writing manner is employed using laser bean, it is possible to produce a wiring board in which positional accuracy of the wirings is superior. FIG. 4 shows a flow sheet of a process for such production of the wiring board. The process of the flow sheet is the same as the conventional process for the production of the wiring board except that the positions of the top portions of the yarns and optionally the yarn extending directions are confirmed (i.e. step (2) of the flow sheet), and that exposing a predetermined area of the photoresist layer so as to form a wiring layer such that at least a portion of, preferably most of and more preferably substantially all of at least one wiring which forms the wiring layer does not extend over the top portions of the yarns based on such confirmation (i.e. step (4) of the flow sheet). Such predetermined area includes a portion of the photoresist layer which portion is located above said at least one wiring.

More concretely, when the wiring board is produced using the directly writing, such production may be for example carried out in the following steps of:

(1) obtaining a laminate by bonding a metal foil to at least one main surface of an insulation substrate;

(2) confirming positions of top portions and optionally extending directions of yarns which are forming a woven fabric;

(3) forming a photoresist layer on the metal foil;

(4) exposing a predetermined area of the photoresist layer which area corresponds to a wiring layer to be formed based on the confirmation of step (2) such that the wiring layer comprises at least one wiring at least a portion of which extends above the woven fabric except the confirmed top portions of the yarns; and (5) removing the photoresist layer except the exposed area, so as to expose the metal foil under the removed photoresist layer; and (6) removing the exposed metal foil by etching, so that the wiring layer is formed.

The above confirmation of the top portions may be carried out in any appropriate manner. For example, the woven fabric which forms the insulation substrate is imaged from the above thereof by using an optical camera, whereby confirming the positions of the top portions of the yarns which form the woven fabric. Then, the photoresist layer is exposed by laser beam, namely subjected to the direct wiring such that at least a portion of the wiring layer to be formed through which portion for example a high frequency signal passes (for example, such portion corresponds to a wiring through which such signal flows) does not extend over the top portions of the yarn. Thereafter, developing and etching are carried out, so that the predetermined portion of the wiring layer does not extend over the top portions. It is noted that the direct writing as described above is effective in that accuracy as to wiring location is improved. Further, confirmation of the top portions may be carried out before step (1) or after step (3), but preferably between steps (1) and (3) as explained above.

In the embodiment as shown in FIG. 3, the wiring board according to the present invention is a both sided wiring board which has a wiring layer having said at least one wiring on each of its main surfaces wherein both of the wiring layers are electrically connected through an electrically conductive member which is located through the insulation substrate, but optionally only one of the wiring layers of the wiring board may have said at least one wiring. The wiring board according to the present invention may comprise and electronic member connected to an end of said at least one wiring, and also may have a land, a pad or the like at the end of said at least one wiring to which such electronic member is connected. Such electronic member includes for example an electronic part and an electrically conductive material which is present through the wiring board. The electronic includes for example, a filter, an antenna and the like, and those which work particularly in a high frequency range are preferable. Such electrically conductive material includes, for example, an electrically conductive material of an electrically conductive paste which is present in a through hole and an electrically plates portion around a through hole which is located through an insulation substrate of the wiring board.

Further, it is possible to produce a multi-layer wiring board by laminating, onto one or each side of a wiring board having a wiring layer according to the present invention, other wiring board (i.e. a second wiring board) having other wiring layer(s) (i.e. a second wiring layer(s)) and electrically connecting those wiring layers as predetermined. Such latter (or second) wiring board may or may not be the wiring board according to the present invention. Thus, using the wiring board according to the present invention, a multi-layer wiring board can be easily produced which has any intended number of the wiring layers. By using such multi-layer wiring board, densification of wirings becomes possible, and it is possible to provide such wiring board effective for the compactness of an electronic equipment.

In the wiring board according to the present invention, when the thickness of the coating layer 26 of the insulation substrate is large, the effects of the dielectric properties of the yarns on the wiring portion are reduced. Thus, when the thickness of the coating layer 26 is small, the inclusion of said at least one wiring by the wiring layer is very effective.

EXAMPLES

A glass-epoxy prepreg (manufactured by Hitachi Chemical Co., Ltd., 679N, thickness: 100 µm) was used as the insulation substrate. An electrodeposited copper foil (manufactured by Furukawa Circuit Foil Co., Ltd., thickness: 12 µm) was used as a copper foil. The copper foil was laminated on and thermo-compression bonded to one main surface of the insulation substrate with a pressure of 50 kgf/cm² at a temperature of 200° C. for two hours and prepared a cupper clad laminated sheet. The prepreg comprised a plain woven fabric of glass yarns, and the woven fabric had a thickness (corresponding to a thickness of a bracket with the reference number 10 in FIG. 2) of 80 μm, and the warp yarns and also the weft yarns had an oval cross-section of which major axis has a length of 400 μm and minor axis 40 μm). Further, a pitch of the warp yarns was 420 μm, and a pitch of the weft yarns was also 420 μm. A thickness of the coating layer (corresponding to a thickness of a bracket with the reference number 26 in FIG. 2) was 10 μm.

Considering the positions of the top portions of the yarns and also the extending directions of the yarns which were confirmed beforehand, wirings which correspond to the wiring 54 (α=45°) and the wiring 60 in FIG. 1 were formed by etching the copper clad laminated sheet, and these wirings are referred to as wirings (a) and wiring (b), respectively. It is noted that a width of the wirings was 200 μm, and a length of the wirings varied as 10 mm, 20 mm and 50 mm. For the purpose of comparison, wiring (c) was similarly formed which extended over the top portions of the yarns and which corresponds to for example the line b—b in FIG. 1.

Transmission losses (at 500 MHz, 1 GHz and 5 GHz) of thus formed wirings were measured by using a network analyzer (manufactured by Hewlett-Packard, 8720ES). Results of the transmission loss (S 21) are shown in the following Tables 1 to 3 (unit: dB):

TABLE 1

(length of wiring: 10 mm)

|  | wiring (a) | wiring (b) | wiring (c) |
|---|---|---|---|
| 500 MHz | −0.1 | −0.1 | −0.1 |
| 1 GHz | −0.1 | −0.1 | −0.15 |
| 5 GHz | −0.15 | −0.12 | −0.4 |

TABLE 2

(length of wiring: 20 mm)

|  | wiring (a) | wiring (b) | wiring (c) |
|---|---|---|---|
| 500 MHz | −0.12 | −0.12 | −0.3 |
| 1 GHz | −0.14 | −0.14 | −0.5 |
| 5 GHz | −0.2 | −0.19 | −0.8 |

TABLE 3

(length of wiring: 50 mm)

|  | wiring (a) | wiring (b) | wiring (c) |
|---|---|---|---|
| 500 MHz | −0.5 | −0.5 | −0.8 |
| 1 GHz | −0.7 | −0.7 | −1.5 |
| 5 GHz | −1 | −1 | −3 |

It is seen from the above Tables that the transmission losses of wirings (a) and (b) according to the present invention are smaller than those of wiring (c), and that when the frequency becomes higher, the difference in the transmission losses between wirings (a) and (b) and wiring (c) becomes larger, which means the effects of the present invention are remarkable.

Figure 5:
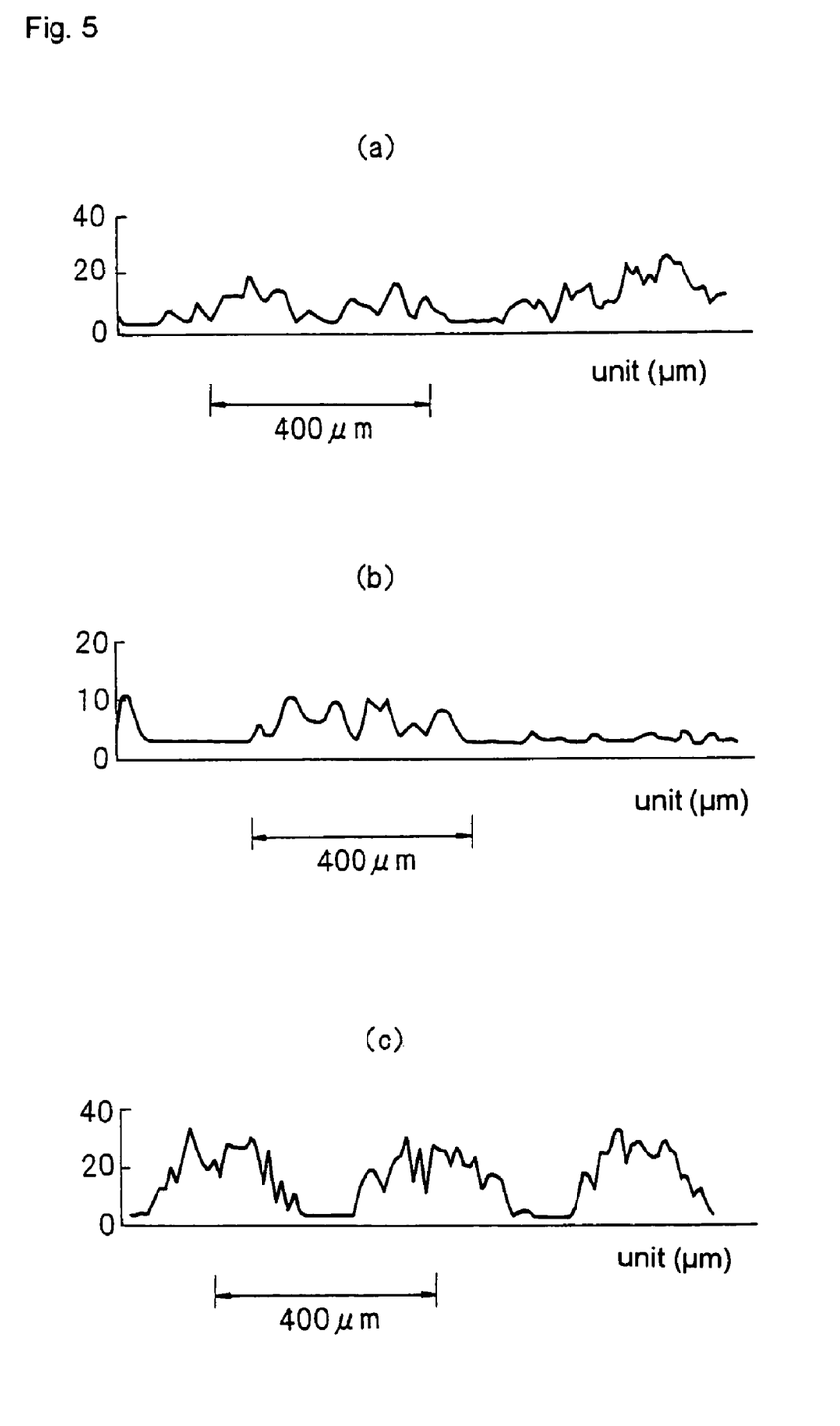
FIG. 5 shows results of profile measurements of portions of a woven fabric of an insulation substrate which was used in the Examples.

A portion of each of wirings (a), (b) and (c) was cut out together with the underlying insulation substrate and the resin which formed the insulation substrate was removed by solving it with methyl ethyl ketone, and a surface profile of the left woven fabric along the wiring extending direction was measured using a three dimensional surface profiler. Results of such measurements are shown in FIG. 5 wherein the abscissa (unit: μm) indicates a length along the extending direction of the wiring, and the ordinate (unit: μm) indicates a length along a direction perpendicular to the extending direction, and the scales thereof are different. It is noted that the wiring is not shown in each surface profile. It is seen from FIG. 5 that when the surface profiles below wirings (a) and (b) which extend above the woven fabric except the top portions of the yarns are compared with the surface profile below wiring (c) which extends above the top portions of the yarns of the woven fabric, the distance from the wiring layer to the yarn (which corresponds to the length "a" in FIG. 2) in the cases of wirings (a) and (b) varies not so greatly depending on the position of the length, and an average protruding height of the yarn (for example, an average height of the protrusions over a range of 400 μm indicted by the both way arrow in FIG. 5) is smaller in the cases of wirings (a) and (b) and said length varies not so greatly depending on the position of the length. Therefore, the dielectric properties of the insulation substrate under wirings (a) and (b) vary not so largely depending on the position of the wiring portion of wirings (a) and (b), and wirings (a) and (b) are less affected by the glass yarns which have the inferior dielectric properties.

Figure 6:
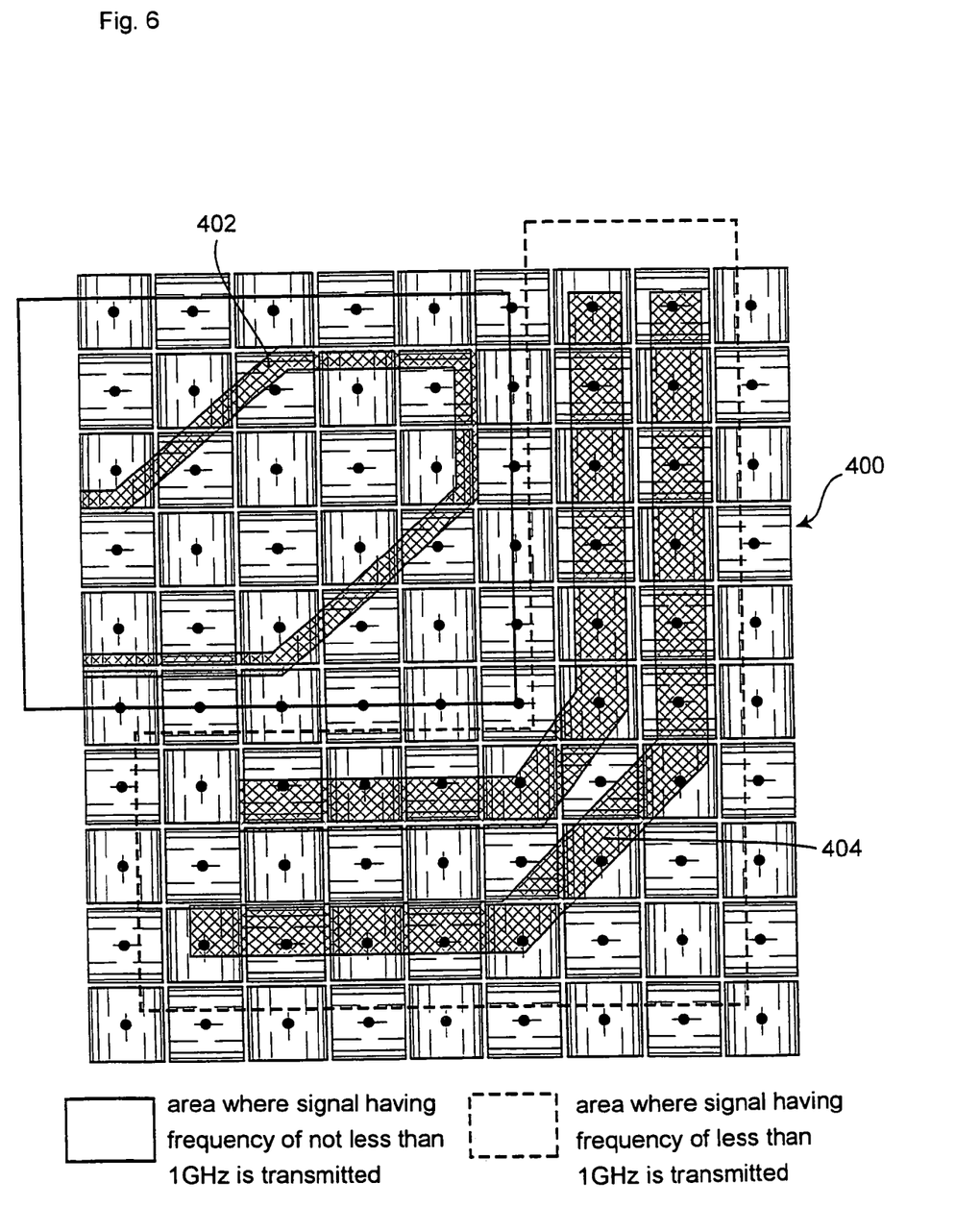
FIG. 6 schematically shows a wiring board according to the present invention when viewing from the above thereof.

The present invention of which concept resides in that the wiring avoids extending over the top portions of the yarns of the woven fabric which form the insulation substrate is particularly effective in the wiring board having a wiring through which a high frequency signal passes. Such wiring board when viewing from the above thereof is schematically shown in FIG. 6. In FIG. 6, the yarns forming the woven fabric extend perpendicularly and also horizontally, and the top portions of the yarns are shown with the black dots (•). It is noted that a wiring layer of the wiring board 400 shown in FIG. 6 has both of a wiring 402 to which the present invention is applied (that is, a wiring which is formed to extend over the woven fabric except the top portions of the yarns) as well as a wiring 404 which is formed to extend above the top portions. In such wiring board of FIG. 6, an area is surrounded by a solid line which area includes the wiring 402 which passes a signal having a high frequency (for example not less than 1 GHz), while an area is surrounded by a broken line which area includes the wiring 404 which passes a signal having a lower frequency (for example less than 1 GHz).

Finally, the present application includes the following embodiments:

Embodiment 1

A wiring board comprising an insulation substrate and a wiring layer which is located on at least one main surface of the insulation substrate wherein the insulation substrate comprises a woven fabric which is made of yarns (or threads) and an organic resin with which the woven fabric is impregnated, and at least one wiring of wirings which form the wiring layer extends over the woven fabric except top portions of the yarns.

Embodiment 2

The wiring board according to Embodiment 1 wherein said at least one wiring extends to form an angle with a direction along which the yarns forming the woven fabric extends.

Embodiment 3
The wiring board according to Embodiment 1 wherein said at least one wiring extends parallel to a direction along which the yarns forming the woven fabric extends.

Embodiment 4
The wiring board according to any one of Embodiments 1 to 3 wherein a width of said at least one wiring is smaller than an arranging pitch of the yarns.

Embodiment 5
The wiring board according to any one of Embodiments 1 to 4 wherein a width of said at least one wiring is smaller than a thickness of the yarns.

Embodiment 6
The wiring board according to any one of Embodiments 1 to 5 wherein the woven fabric has a plain weave structure.

Embodiment 7
The wiring board according to any one of Embodiments 1 to 6 wherein said at least one wiring is used for passing a current having a high frequency.

Embodiment 8
The wiring board according to any one of Embodiments 1 to 7 wherein said at least one wiring is used for passing a current having a frequency of not less than 1 GHz.

Embodiment 9
The wiring board according to any one of Embodiments 1 to 8 wherein said at least one wiring is operatively connected to an electronic part which works at a high frequency.

Embodiment 10
The wiring board according to Embodiment 9 wherein the electronic part works at a frequency of not less than 1 GHz.

Embodiment 11
The wiring board according to any one of Embodiments 1 to 10 wherein other wiring layer is further formed on the other main surface of the insulation substrate, and both of the wiring layers are connected with each other by an electrically conductor which is located through the insulation substrate.

Embodiment 12
The wiring board according to any one of Embodiments 1 to 11 wherein a dielectric property of the woven fabric is inferior to that of the organic resin.

Embodiment 13
The wiring board according to any one of Embodiments 1 to 12 wherein the woven fabric is formed of glass fiber yarns, and impregnated with an epoxy resin.

Embodiment 14
The wiring board according to any one of Embodiments 1 to 13 wherein the insulation substrate comprises a coating layer of the organic resin which layer is located on the surface of the woven fabric.

Embodiment 15
A multi-layer wiring board comprising the wiring board according to any one of Embodiments 1 to 14 and a wiring board as a second wiring board which is placed (or laminated) on and bonded to said at least one main surface of the former wiring board wherein the second wiring board comprises a wiring layer as a second wiring layer on its at least main surface, and the wiring layer of the wiring boards and the second wiring layer of the second wiring board are electrically connected with each other.

Embodiment 16
A process for the production of a wiring board which comprises an insulation substrate comprising a woven fabric made of yarns and an organic resin with which the woven fabric is impregnated as well as a wiring layer which is located on at least one of main surfaces of the insulation substrate, which process comprising the step of:
forming the wiring layer such that at least one wiring of wirings which form the wiring layer extends over the woven fabric except top portions of the yarns.

Embodiment 17
The process according to Embodiment 16 wherein the formation of the wiring layer is carried out by:
providing a laminate composite by bonding a metal foil onto said at least one main surface of the insulation substrate,
confirming the top portions of the yarns which form the woven fabric,
forming a photoresist layer on the metal foil,
exposing a predetermined area of the photoresist layer which area corresponds to the wiring layer to be formed such that the wiring layer comprises said at least one wiring at least a portion of which extends above the woven fabric except the confirmed top portions of the yarns; and
removing the photoresist layer except the exposed area so as to expose the metal foil under the removed photoresist layer; and
removing the exposed metal foil by etching, so that the wiring layer is formed.

Embodiment 18
The process according to Embodiment 16 or 17 wherein said at least one wiring extends to form an angle with a direction along which the yarns forming the woven fabric extends.

Embodiment 19
The process according to Embodiment 16 or 17 wherein said at least one wiring extends parallel to a direction along which the yarns forming the woven fabric extends.

Embodiment 20
The process according to any one of Embodiments 16 to 19 wherein a width of said at least one wiring is smaller than an arranging pitch of the yarns.

Embodiment 21
The process according to any one of Embodiments 16 to 20 wherein a width of said at least one wiring is smaller than a thickness of the yarns.

Embodiment 22
The process according to any one of Embodiments 16 to 21 wherein the woven fabric has a plain weave structure.

Embodiment 23
The process according to any one of Embodiments 16 to 22 wherein said at least one wiring is used for passing a current having a frequency of not less than 1 GHz.

Embodiment 24
The process according to any one of Embodiments 16 to 23 wherein a dielectric property of the woven fabric is inferior to that of the organic resin.

Embodiment 25
The process according to any one of Embodiments 16 to 24 wherein the woven fabric is formed of glass fiber yarns, and impregnated with an epoxy resin.

The present application claims a Paris Convention priority based on Japanese Patent Application No. 2002-372155 filed on Dec. 24, 2002 (Title of the Invention: Wiring board and a production process thereof), and all of the contents of said Application are hereby incorporated by reference.

The invention claimed is:
1. A wiring board comprising:
an insulation substrate including a woven fabric impregnated with an organic resin, said woven fabric having parallel warps extending a first direction and parallel wefts extending in a second direction, with said wefts and said warps being interweaved with each other such that each of said warps and each of said wefts extend in an undulating manner so as to define crests and valleys; and a wiring on at least one main surface of said insulation substrate, with at least one wiring of said wiring layer extending over said woven fabric but not over any of said crests, wherein said at least one wiring is to be used for passing a current having a frequency of at least 1 GHz.

2. The wiring board according to claim 1, wherein said each of said warps and said each of said wefts extend in the undulating manner so as to define regularly occurring crests and valleys.

3. The wiring board according to claim 2, wherein said at least one wiring extends over said woven fabric in a direction that forms and angle with said first direction and said second direction.

4. The wiring board according to claim 2, wherein said at least one wiring extends over said woven fabric in a direction that is parallel to one of said first direction and second direction.

5. The wiring board according to claim 2, wherein a width of said at least one wiring is smaller than an arranging pitch of said warps and an arranging pitch of said wefts.

6. The wiring board according to claim 2, wherein a width of said at least one wiring is smaller than a thickness of said each of said warps and said each of said wefts.

7. The wiring board according to claim 2, wherein said woven fabric is of a plain weave.

8. The wiring board according to claim 2, wherein said at least one wiring is to be operatively connected to an electronic part that is to work at a high frequency.

9. The wiring board according to claim 8, wherein the electronic part is to work at a frequency of at least 1 GHz.

10. The wiring board according to claim 2, further comprising:

another wiring layer on another main surface of said insulation substrate, with said another wiring layer and said wiring layer being interconnected via an electrical conductor that extends through said insulation substrate.

11. The wiring board according to claim 2, wherein a dielectric property of said woven fabric is inferior to a dielectric property of said organic resin.

12. The wiring board according to claim 2, wherein said warps and wefts comprise glass fiber yarns, and said organic resin comprises an epoxy resin.

13. The wiring board according to claim 7, wherein said insulation substrate includes a coating layer of said organic resin on a surface of said woven fabric.

14. The wiring board according to claim 7, wherein said woven fabric is of a satin weave.

15. The wiring board according to claim 7, wherein said woven fabric is of a twill weave.

16. A multi-layer wiring board comprising:

a first wiring board including (i) an insulation substrate including a woven fabric impregnated with an organic resin, said woven fabric having parallel warps extending in a first direction and parallel wefts extending in a second direction, with said wefts and said warps being interweaved with each other such that each of said warps and each of said wefts extend in an undulating manner so as to define crests and valleys, and (ii) a first wiring layer on at least one main surface of said insulation substrate, with at least one wiring of said first wiring layer extending over said woven fabric but not over any of said crests; wherein said at least one wiring is to be used for passing a current having a frequency of at least 1 GHz; and a second wiring board bonded to a main surface of said first wiring board, said second wiring board including (i) a substrate, and (ii) a second wiring layer on at least one main surface of said substrate, with said second wiring layer being electrically connected to said first wiring layer.

17. The multi-layer wiring board according to claim 16, wherein said each of said warps and said each of said wefts extend in the undulating manner so as to define regularly occurring crests and valleys.

* * * * *

UNITED STATES PATENT AND TRADEMARK OFFICE
CERTIFICATE OF CORRECTION

| | | |
|---|---|---|
| PATENT NO. | : 7,056,571 B2 | Page 1 of 1 |
| APPLICATION NO. | : 10/739156 | |
| DATED | : June 6, 2006 | |
| INVENTOR(S) | : Satoru Tomekawa et al. | |

It is certified that error appears in the above-identified patent and that said Letters Patent is hereby corrected as shown below:

Claim 13
In column 18, line 8, change "claim 7" to --claim 2--.

Claim 14
In column 18, line 11, change "claim 7" to --claim 2--.

Claim 15
In column 18, line 14, change "claim 7" to --claim 2--.

Signed and Sealed this

Twenty-seventh Day of March, 2007

JON W. DUDAS
*Director of the United States Patent and Trademark Office*